United States Patent
Xing et al.

(10) Patent No.: US 11,799,005 B2
(45) Date of Patent: Oct. 24, 2023

(54) SPLIT-GATE FLASH MEMORY CELL WITH IMPROVED CONTROL GATE CAPACITIVE COUPLING, AND METHOD OF MAKING SAME

(71) Applicant: Silicon Storage Technology, Inc., San Jose, CA (US)

(72) Inventors: Leo Xing, Shanghai (CN); Chunming Wang, Shanghai (CN); Xian Liu, Sunnyvale, CA (US); Nhan Do, Saratoga, CA (US); Guo Xiang Song, Shanghai (CN)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 17/346,524

(22) Filed: Jun. 14, 2021

(65) Prior Publication Data
US 2022/0293756 A1  Sep. 15, 2022

(30) Foreign Application Priority Data
Mar. 11, 2021 (CN) .......................... 202110266241.0

(51) Int. Cl.
*H01L 29/423* (2006.01)
*H01L 29/788* (2006.01)
(Continued)

(52) U.S. Cl.
CPC .. *H01L 29/42328* (2013.01); *H01L 29/40114* (2019.08); *H01L 29/66825* (2013.01); *H01L 29/7883* (2013.01)

(58) Field of Classification Search
None
See application file for complete search history.

(56) References Cited

U.S. PATENT DOCUMENTS

| 5,029,130 | A | 7/1991 | Yeh |
| 6,525,369 | B1 | 2/2003 | Wu |
| (Continued) |

FOREIGN PATENT DOCUMENTS

| CN | 112185970 A | 1/2021 |
| TW | 202008510 A | 2/2020 |
| TW | 202018918 | 5/2020 |

OTHER PUBLICATIONS

PCT Search Report dated Nov. 26, 2021 from the related PCT Patent Application No. US2021/037508.
(Continued)

*Primary Examiner* — Xiaoming Liu
(74) *Attorney, Agent, or Firm* — DLA Piper LLP (US)

(57) ABSTRACT

A method of forming a memory device that includes forming a first insulation layer, a first conductive layer, and a second insulation layer on a semiconductor substrate, forming a trench in the second insulation layer to expose the upper surface of the first conductive layer, performing an oxidation process and a sloped etch process to reshape the upper surface to a concave shape, forming a third insulation layer on the reshaped upper surface, forming a conductive spacer on the third insulation layer, removing portions of the first conductive layer leaving a floating gate under the conductive spacer with the reshaped upper surface terminating at a side surface at a sharp edge, and forming a word line gate laterally adjacent to and insulated from the floating gate. The conductive spacer includes a lower surface that faces and matches the shape of the reshaped upper surface.

4 Claims, 23 Drawing Sheets

(51) Int. Cl.
    *H01L 29/66*     (2006.01)
    *H01L 21/28*     (2006.01)

(56) References Cited

U.S. PATENT DOCUMENTS

| | | |
|---|---|---|
| 6,747,310 B2 | 6/2004 | Fan et al. |
| 8,711,636 B2 | 4/2014 | Do et al. |
| 9,190,532 B2 | 11/2015 | Wang et al. |
| 2006/0062069 A1 | 3/2006 | Jeon |
| 2009/0014776 A1 | 1/2009 | Strenz |
| 2009/0085090 A1 | 4/2009 | Nagai |
| 2016/0133639 A1* | 5/2016 | Tran .................. H01L 29/42328 257/319 |
| 2016/0336415 A1* | 11/2016 | Wu ....................... H01L 29/788 |
| 2017/0317093 A1 | 11/2017 | Wang |
| 2017/0330889 A1* | 11/2017 | Richter ................. H10B 41/43 |
| 2018/0102414 A1 | 4/2018 | Liu |
| 2018/0301562 A1 | 10/2018 | Li |

OTHER PUBLICATIONS

Taiwanese Office Action dated Oct. 5, 2022 corresponding to the related Taiwanese Patent Application No 111102321. (see attached Taiwanese and English translations).

Taiwanese Office Action dated Aug. 21, 2023 corresponding to the related Taiwanese Patent Application No. 112125936.

* cited by examiner

|  | Word line gate (66a) | | Bit line (80) | | Source (58) | | Coupling gate (56a) | |
|---|---|---|---|---|---|---|---|---|
|  | Sel. | Uns. | Sel. | Uns. | Sel. | Uns. | Sel. | Uns. |
| Read | 2.3-2.7V | 0V | 0.8V | 0V | 0V | 0V | 2.3-2.7V | 0V |
| Erase | 10.5-12.5V | 0V | 0V | 0V | 0V | 0V | 0V | 0V |
| Program | 1.4-1.6V | 0V | 1.0uA | 2.5-3.3V | 9.5-10V | 0V | 11.2-11.8V | 0V |

FIG. 17

|  | Word line gate (66e) | | Bit line 80 | | Source (58) | | Coupling gate (56a) | | Erase gate (88) | |
| --- | --- | --- | --- | --- | --- | --- | --- | --- | --- | --- |
|  | Sel. | Uns. | Sel. | Uns. | Sel. | Uns. | Sel. | Uns. | Sel. | Uns. |
| Read | 2.3-2.7V | 0V | 0.8V | 0V | 0V | 0V | 2.3-2.7V | 0V | 0V | 0V |
| Erase | 0V | 0V | 0V | 0V | 0V | 0V | 0V | 0V | 10.5-12.5V | 0V |
| Program | 1.4-1.6V | 0V | 1.0uA | 2.5-3.3V | 4.5V | 0V | 11.2-11.8V | 0V | 4.5V | 0V |

FIG. 23

SPLIT-GATE FLASH MEMORY CELL WITH IMPROVED CONTROL GATE CAPACITIVE COUPLING, AND METHOD OF MAKING SAME

PRIORITY CLAIM

This application claims priority to Chinese Patent Application No. 202110266241.0, filed on Mar. 11, 2021, and titled "Split Gate Flash Memory Cell With Improved Control Gate Capacitive Coupling, And Method Of Making Same."

FIELD OF THE INVENTION

The present invention relates to non-volatile memory arrays.

BACKGROUND OF THE INVENTION

Split gate non-volatile memory cells, and arrays of such cells, are well known. For example, U.S. Pat. No. 5,029,130 ("the '130 patent") discloses an array of split gate non-volatile memory cells, and is incorporated herein by reference for all purposes. The memory cell is shown in FIG. 1. Each memory cell 10 includes source and drain regions 14/16 formed in a semiconductor substrate 12, with a channel region 18 there between. A floating gate 20 is formed over and insulated from (and controls the conductivity of) a first portion of the channel region 18, and over a portion of the drain region 16. A control gate 22 has a first portion 22a that is disposed over and insulated from (and controls the conductivity of) a second portion of the channel region 18, and a second portion 22b that extends up and over the floating gate 20. The floating gate 20 and control gate 22 are insulated from the substrate 12 by a gate oxide 26.

The memory cell is erased (where electrons are removed from the floating gate 20) by placing a high positive voltage on the control gate 22, which causes electrons on the floating gate 20 to tunnel through the intermediate insulation 24 from the floating gate 20 to the control gate 22 via Fowler-Nordheim tunneling.

The memory cell is programmed (where electrons are placed on the floating gate 20) by placing a positive voltage on the control gate 22, and a positive voltage on the drain region 16. Electron current flows from the source region 14 towards the drain region 16. The electrons accelerate and become heated when they reach the gap between the control gate 22 and the floating gate 20. Some of the heated electrons are injected through the gate oxide 26 onto the floating gate 20 due to the attractive electrostatic force from the floating gate 20.

The memory cell is read by placing positive read voltages on the drain region 16 and control gate 22 (which turns on the portion of the channel region 18 under the control gate 22). If the floating gate 20 is positively charged (i.e. erased of electrons and subjected to positive voltage capacitive coupling from the drain region 16), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region 18 under the floating gate 20 is mostly or entirely turned off, and current will not flow (or there will be little flow) across the channel region 18, which is sensed as the programmed or "0" state. Those skilled in the art understand that the source and drain can be interchanged, where the floating gate can extend partially over the source region 14 instead of the drain region 16, as shown in FIG. 2. Also shown in FIG. 2 is the floating gate 20 formed with a concave upper surface that terminates at the side surface of the floating gate 20 in a sharp edge facing the control gate 22, for better erase tunneling efficiency.

Split gate memory cells having more than two gates are also known. For example, U.S. Pat. No. 8,711,636 ("the '636 patent") (incorporated herein by reference for all purposes) discloses a memory cells with an additional coupling gate disposed over and insulated from the source region, for better capacitive coupling to the floating gate. See for example FIG. 3, showing coupling gate 24 disposed over source region 14.

A four gate memory is disclosed in U.S. Pat. No. 6,747,310 ("the '310 patent"), which is incorporated herein by reference for all purposes. For example, as shown in FIG. 4, the memory cells 10 each have source region 14 and drain region 16 separated by channel region 18, where floating gate 20 is disposed over and insulated from a first portion of channel region 18, a select gate 28 is disposed over and insulated from a second portion of the channel region 18, a control gate 22 is disposed over and insulated from the floating gate 20, and an erase gate 30 is disposed over and insulated from the source region 14. Programming is shown by heated electrons from the channel region 18 injecting themselves onto the floating gate 20. Erasing is shown by electrons tunneling from the floating gate 20 to the erase gate 30.

The memory cells of FIGS. 1 and 2 have been successfully used as flash memory for several technology nodes. It is relatively easy to implement with a low cost process and good performance. The memory cell of FIG. 4 has been successfully used as embedded flash for several advanced technology nodes. It has very good quality and a competitive cell size. The memory cells of FIG. 3 are less complex than those of FIG. 4 because they have one less gate in each cell.

As the size of the memory cells 10 are scaled down, it becomes more difficult to achieve the desired capacitive coupling between the floating gate and the control gate, yet avoid unwanted capacitive coupling between the floating gate and other gates which can detrimentally affect performance. There is a need to improve performance at reasonable cost.

BRIEF SUMMARY OF THE INVENTION

The aforementioned needs are addressed by a method of forming a memory device that includes forming a first insulation layer on an upper surface of a semiconductor substrate, forming a first conductive layer on the first insulation layer, forming a second insulation layer on the first conductive layer, forming a trench in the second insulation layer that exposes an upper surface portion of the first conductive layer, performing an oxidation process and a sloped etch process to reshape the upper surface portion of the first conductive layer at a bottom of the trench from a planar shape to a concave shape, forming a third insulation layer on the reshaped upper surface portion of the first conductive layer at the bottom of the trench, forming a conductive spacer in the trench and on the third insulation layer, and removing portions of the first conductive layer, leaving a floating gate of the first conductive layer under the conductive spacer and includes the upper surface portion with the concave shape terminating at a side surface of the floating gate at a sharp edge, wherein the conductive spacer includes a lower surface that faces the upper surface portion of the floating gate, has a shape matching the concave shape of the upper surface portion of the floating gate, and is insulated from the upper surface portion of the floating gate by a portion of the third insulation layer that has a uniform thickness, forming a word line gate laterally adjacent to and insulated from the floating gate, and forming spaced apart source and drain regions in the semiconductor substrate with a channel region of the semiconductor substrate extending there between, wherein the floating gate is disposed over and insulated from a first portion of the channel region for controlling a conductivity of the first portion of the channel region, and wherein the word line gate is disposed over and insulated from a second portion of the channel region for controlling a conductivity of the second portion of the channel region.

A memory cell includes spaced apart source and drain regions in a semiconductor substrate with a channel region of the semiconductor substrate extending there between, a floating gate disposed over and insulated from a first portion of the channel region for controlling a conductivity of the first portion of the channel region, wherein the floating gate includes an upper surface having a concave shape that terminates at a side surface of the floating gate at a sharp edge, a word line gate that includes a first portion disposed over and insulated from a second portion of the channel region for controlling a conductivity of the second portion of the channel region, a second portion disposed at least partially over the floating gate, and a notch facing the sharp edge of the floating gate, and a coupling gate disposed over and insulated from the floating gate and including a lower surface that faces the upper surface of the floating gate, has a shape matching the concave shape of the upper surface of the floating gate, and is insulated from the upper surface of the floating gate by an insulation layer of uniform thickness.

A memory cell includes spaced apart source and drain regions in a semiconductor substrate with a channel region of the semiconductor substrate extending there between, a floating gate disposed over and insulated from a first portion of the channel region for controlling a conductivity of the first portion of the channel region, wherein the floating gate includes an upper surface having a concave shape that terminates at a side surface of the floating gate at a sharp edge, a word line gate disposed over and insulated from a second portion of the channel region for controlling a conductivity of the second portion of the channel region, a coupling gate disposed over and insulated from the floating gate and including a lower surface that faces the upper surface of the floating gate, has a shape matching the concave shape of the upper surface of the floating gate, and is insulated from the upper surface of the floating gate by an insulation layer of uniform thickness, and an erase gate disposed over and insulated from the floating gate and the coupling gate, and including a notch facing the sharp edge of the floating gate.

Other objects and features of the present invention will become apparent by a review of the specification, claims and appended figures.

BRIEF DESCRIPTION OF THE DRAWINGS

FIG. 17 is a table of exemplary, non-limiting operational voltages and current for the pairs of memory cells.

FIG. 23 is a table of exemplary, non-limiting operational voltages and current for the pairs of memory cells according to the alternate embodiment.

DETAILED DESCRIPTION OF THE INVENTION

Figure 1:
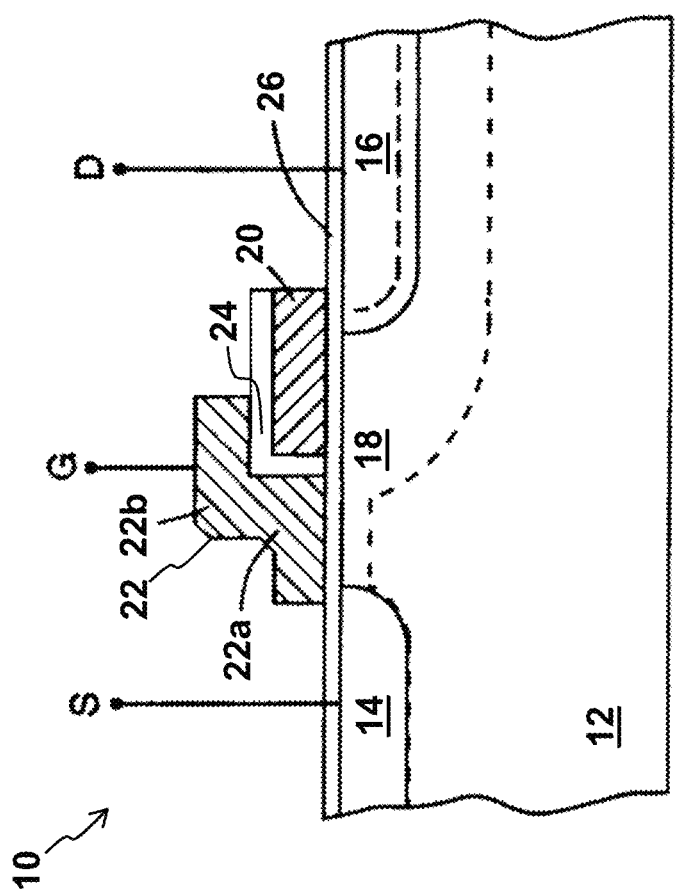
FIG. 1 is a cross sectional view of a conventional two-gate memory cell.
Figure 2:
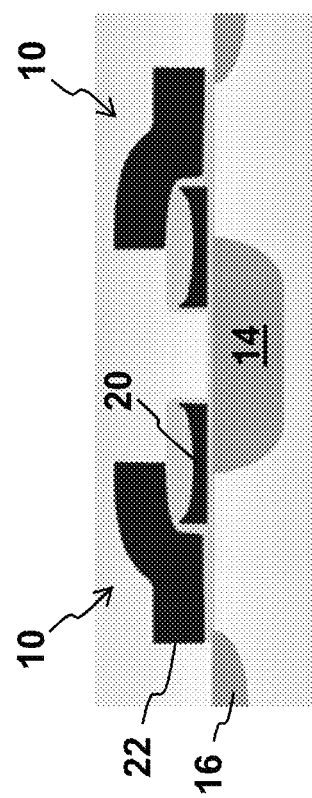
FIG. 2 is a cross sectional view of a conventional two-gate memory cell.
Figure 3:
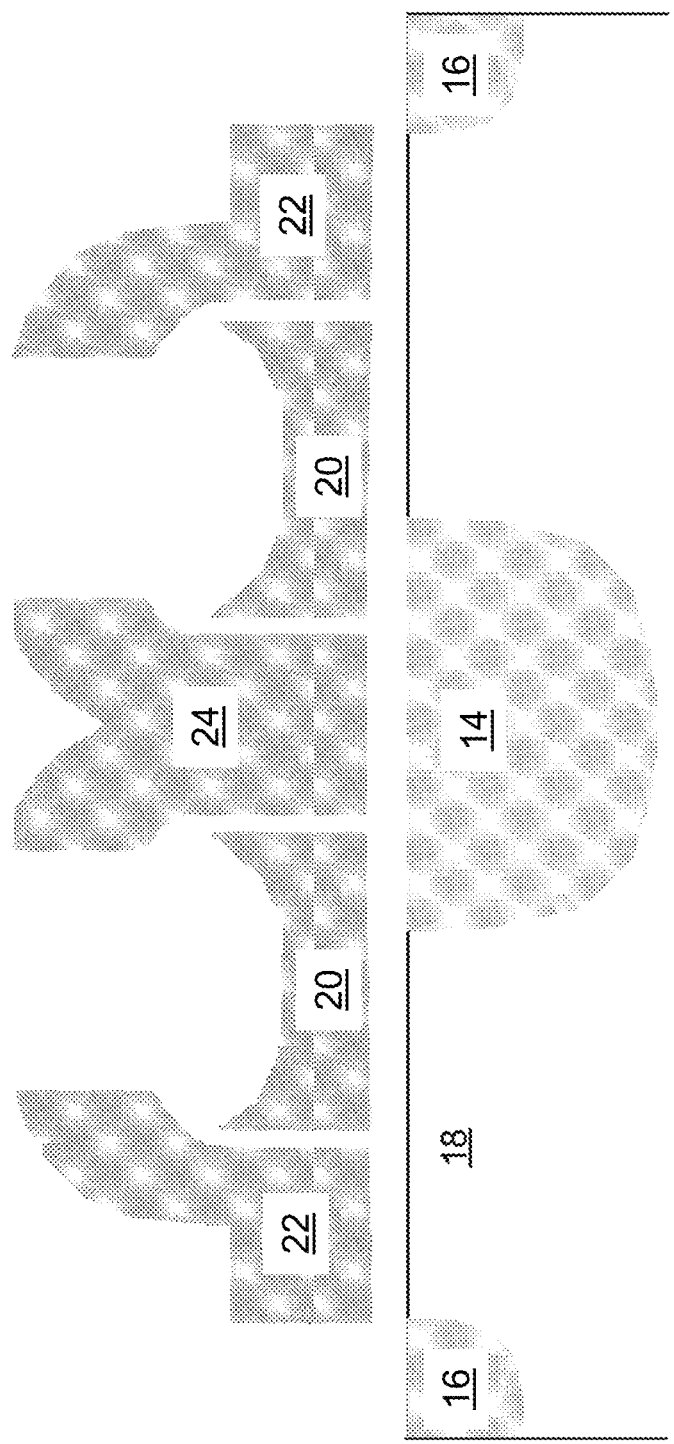
FIG. 3 is a cross sectional view of a conventional three-gate memory cell.
Figure 4:
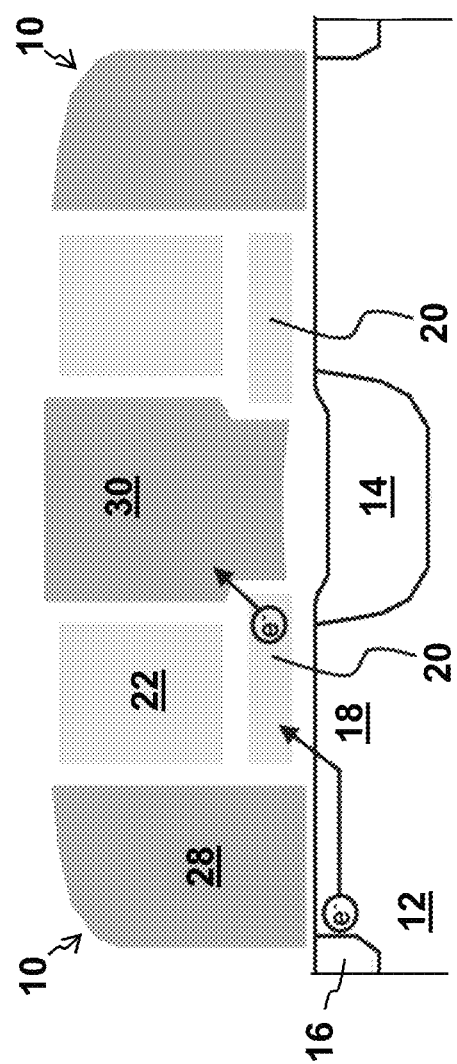
FIG. 4 is a cross sectional view of a conventional four-gate memory cell.
Figure 5:
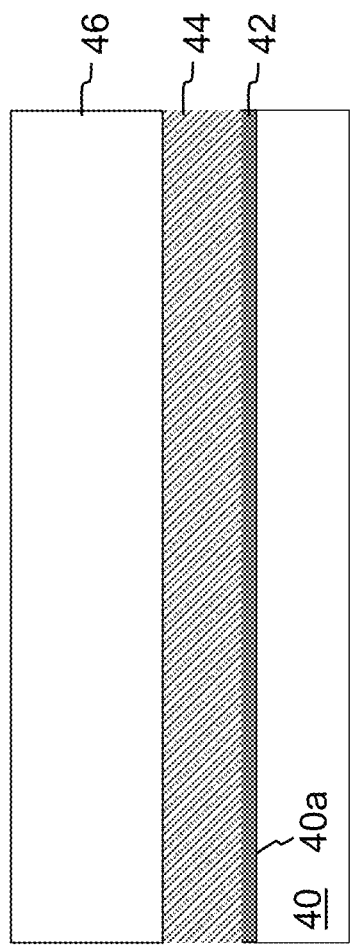
FIGS. 5-15 are cross sectional views illustrating the steps in forming pairs of memory cells.

The present embodiments provide a new memory cell design and method of making same. FIGS. 5-15 show the formation of the memory cells on a semiconductor substrate. It should be appreciated that while the formation of a pair of memory cells is shown in the figures and described below, simultaneous formation of multiple pairs of such memory cells can be performed. The process begins by forming a (first) insulation layer 42 such as silicon dioxide (referred to herein as "oxide") on the upper surface 40*a* of a semiconductor substrate 40 such as silicon. A (first) conductive layer 44 such as polysilicon is formed on insulation layer 42. A (second) insulation layer 46 such as silicon nitride (referred to herein as "nitride") is formed on conductive layer 44, as shown in FIG. 5.

Figure 6:
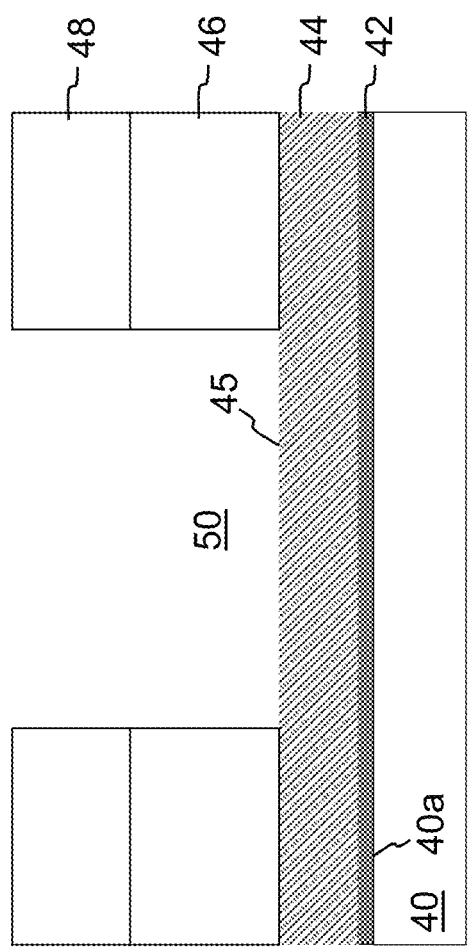
Figure 7:
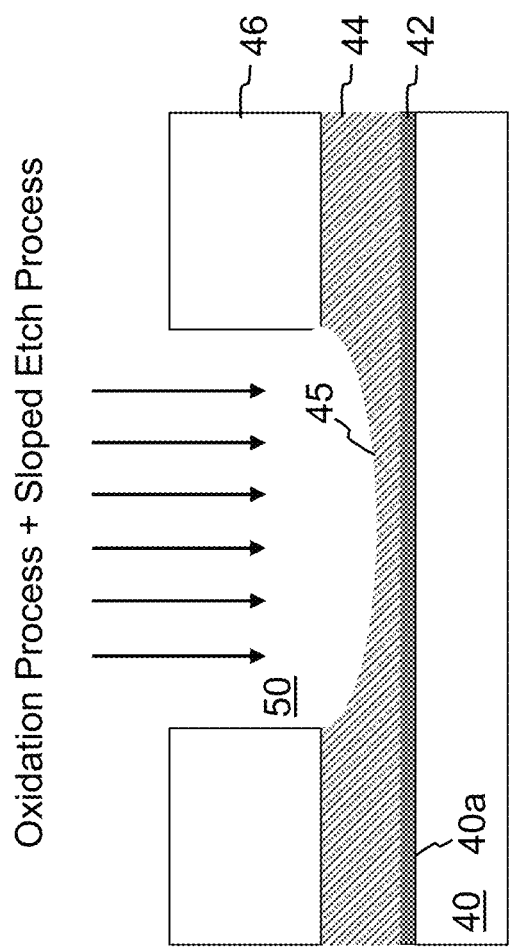

A masking step is performed (i.e., deposit photoresist 48, selectively expose and remove portions of the photoresist 48), followed by an etch, is used to form a trench 50 in the insulation layer 46, exposing an upper surface portion 45 of the conductive layer 44 at the bottom of the trench 50, as shown in FIG. 6. The upper surface portion 45 of conductive layer 44 is planar. Appropriate implants into conductive layer 44 can be performed at this time. After photoresist 48 is removed, multiple processes are performed to reshape the upper surface portion 45 of conductive layer 44 at the bottom of the trench 50 from a planar shape to a curved, concave shape, as shown in FIG. 7. Specifically, an oxidation process (e.g., thermal oxidation) is performed to oxidize the upper surface portion 45 of conductive layer 44 at the bottom of the trench 50, where the oxidation consumes more of the conductive layer 44 at the center of the trench 50 than near the sides of the trench 50. An oxide etch is then used to remove the oxidized portion of conductive layer 44. Then, a sloped etch process is performed that removes material from the conductive layer 44 at the center of the trench 50 at a greater rate than near the sides of the trench 50. The combination of the oxidation process and the sloped etch process achieves a significant curvature in the upper surface portion 45 of the conductive layer 44 at the bottom of trench 50. It should be appreciated that the order of the processes can be reversed, whereby the sloped etch process is performed first, followed by the oxidation process.

Figure 8:
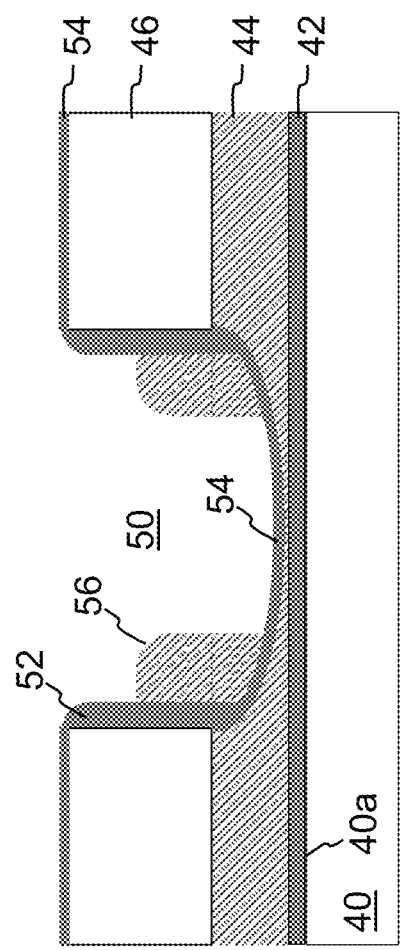
Figure 9:
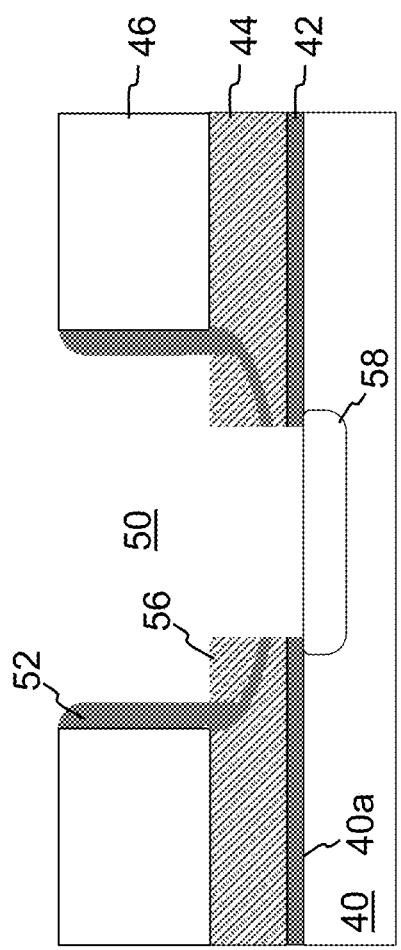

Insulation spacers 52, also described as first insulation spacers 52, such as oxide are formed on the sides of trench 50 by insulation deposition and insulation etch. Formation of spacers involves the deposition of a material over the contour of a structure, followed by an anisotropic etch process, whereby the material is removed from horizontal surfaces of the structure, while the material remains largely intact on vertically oriented surfaces of the structure (often with a rounded upper surface). A (third) insulation layer 54 such as oxide is formed on the structure by deposition of insulation material, which also thickens spacers 52. At least the portion of insulation layer 54 on upper surface portion 45 of conductive layer 44 has a uniform thickness. Conductive spacers 56 such as polysilicon are formed in trench 50 by deposition and etch, as shown in FIG. 8. One or more etches are then performed to remove the exposed portions of insulation layer 54, conductive layer 44 and insulation layer 42 from the bottom of trench 50 (i.e. between conductive spacers 56), exposing the upper surface 40a of semiconductor substrate 40. The height of conductive spacers 56 is also reduced by these etches, in one example the conductive spacers 56 are reduced such that the upper surfaces of conductive spacers 56 are substantially even with the upper surface of the portions of conductive layer 44 under insulation layer 46. An optional insulation layer can be formed on the exposed upper surface 40a of semiconductor substrate 40. An implantation is then performed to form source region 58 in the semiconductor substrate 40 underneath the trench 50, as shown in FIG. 9.

Figure 10:
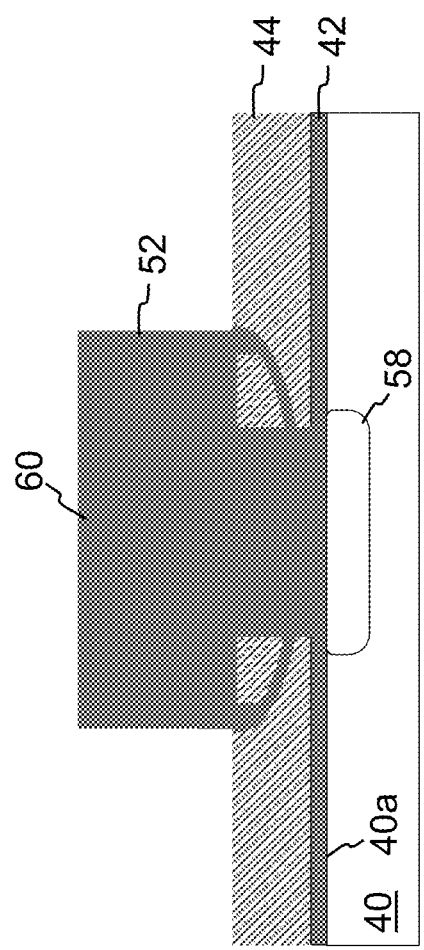
Figure 11:
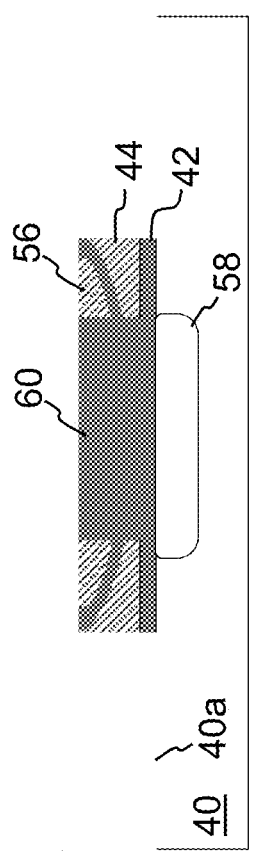

The trench 50 is then filled with insulation material 60 such as oxide by deposition followed by etch back or CMP (chemical mechanical polish) such that insulation layer 46 exposed. Optionally further etch back is used to lower the upper surface of insulation material 60 below the level defined by insulation layer 46. An etch is then performed to remove insulation layer 46, as shown in FIG. 10. An anisotropic etch is then performed to remove the exposed portions of conductive layer 44. Optionally, a non-selective etch is used to remove both insulation material 60 and conductive layer 44, in which case the height of insulation material 60 is reduced. An implantation can then be performed through the exposed portions of insulation layer 42 and into the semiconductor substrate 40 to form a word line channel implant. An etch is then performed to remove the exposed portions of insulation layer 42 and to lower the upper surface of insulation material 60 (in one non-limiting example to expose conductive spacers 56—i.e., such that the upper surface of insulation material 60 is substantially even with the upper surface of conductive spacers 56), as shown in FIG. 11.

Figure 12:
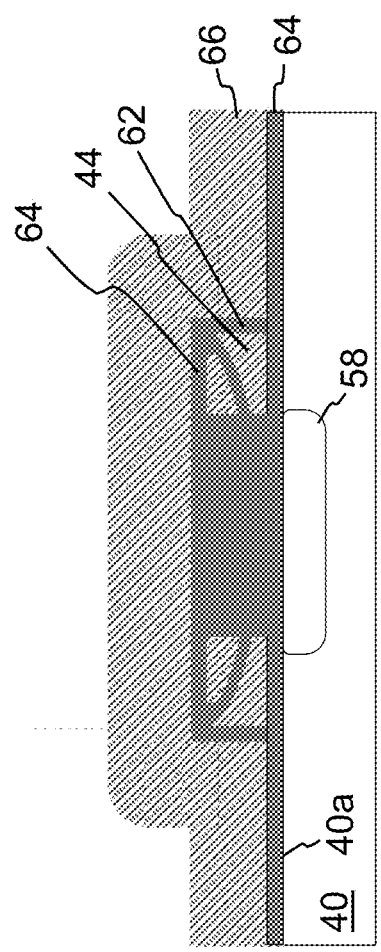
Figure 13:
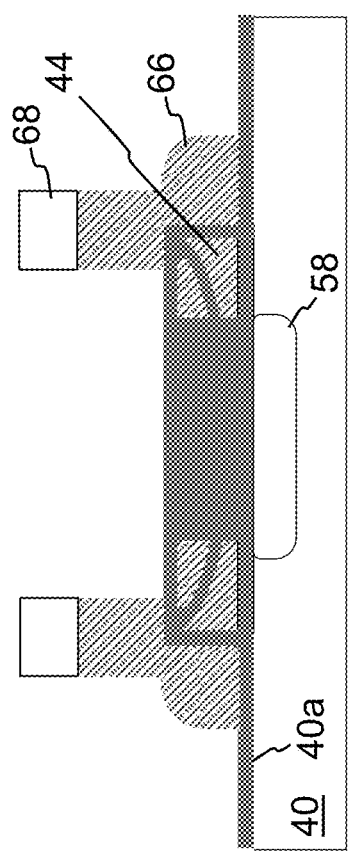
Figure 14:
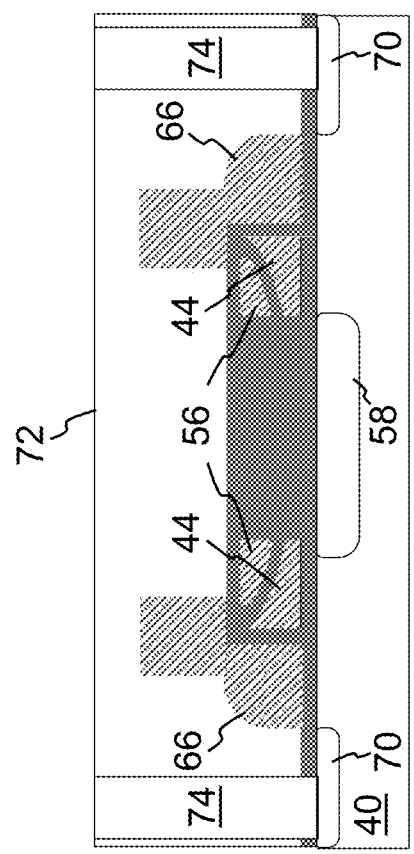

Insulation spacers 62, also described as second insulation spacers 62, such as oxide, are formed on the sides of the structure by deposition and etch. A (fourth) insulation layer 64 such as oxide is formed on the structure (e.g., by deposition of insulation material), which also thickens insulation spacers 62. A (second) conductive layer 66 such as polysilicon is formed on insulation layer 64 and insulation spacers 62, as shown in FIG. 12. Photoresist 68 is formed over conductive layer 66, and removed except for blocks of photoresist 68, each positioned vertically over one of the sidewalls of conductive layer 44. An etch is then used to remove portions of conductive layer 66 except for portions laterally and indirectly adjacent conductive layer 44 and under photoresist 68, as shown in FIG. 13. After photoresist 68 is removed, an implantation is performed to form drain regions 70 in the semiconductor substrate 40 adjacent the remaining portions of conductive layer 66. The structure is covered in insulation material 72 such as inter-layer dielectric (ILD) oxide, and contacts 74 extending through the insulation material 72 and to the drain regions 70 are formed by a masking step, etching through the insulation material 72 to create contact holes that expose the drain regions 70, and filling the contact holes with conductive material, as shown in FIG. 14. Contacts are similarly formed to each of conductive layers 66 and conductive spacers 56, in one embodiment, simultaneously with the formation of contacts 74.

Figure 15:
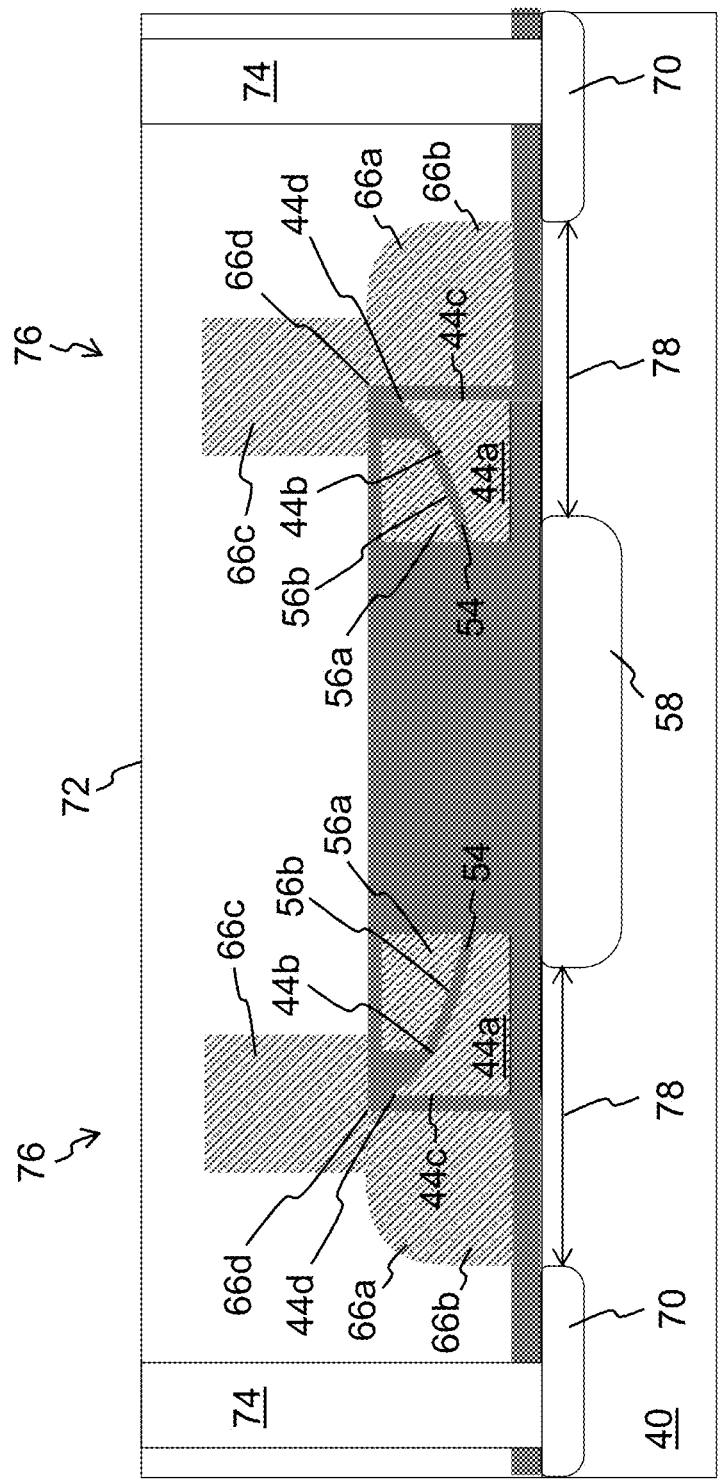

The final memory cell structure is shown in FIG. 15. Pairs of memory cells 76 are formed, with each memory cell 76 including a shared source region 58 and a respective drain region 70, with a channel region 78 of the semiconductor substrate 40 extending there between, a floating gate 44a (remaining portion of conductive layer 44) disposed over and controlling the conductivity of a first portion of the channel region 78 (and disposed over a portion of the source region 58), a word line gate 66a (remaining portion of conductive layer 66) disposed over and controlling the conductivity of a second portion of the channel region 78, and a coupling gate 56a (remaining portion of conductive spacer 56) disposed over the floating gate 44a. The floating gate 44a has a sloped, concave upper surface 44b (remaining part of upper surface portion 45) that terminates at the side surface 44c in a sharp edge 44d. The coupling gate 56a has a lower surface 56b that matches the concave shape of the upper surface 44b of floating gate 44a, and separated from it by the remaining portion of insulation layer 54. The word line gate 66a has a first portion 66b laterally and indirectly adjacent the floating gate 44a (and is over and controls the conductivity of a second portion of the channel region 78), a second portion 66c that is at least partially over floating gate 44a (i.e., there is at least some vertical overlap between the second portion 66c and floating gate 44a) and at least partially over the coupling gate 56a (i.e., there is at least some vertical overlap between the second portion 66c and coupling gate 56a), and a notch 66d that faces the sharp edge 44d of floating gate 44a (for enhanced tunneling during erase).

Figure 16:
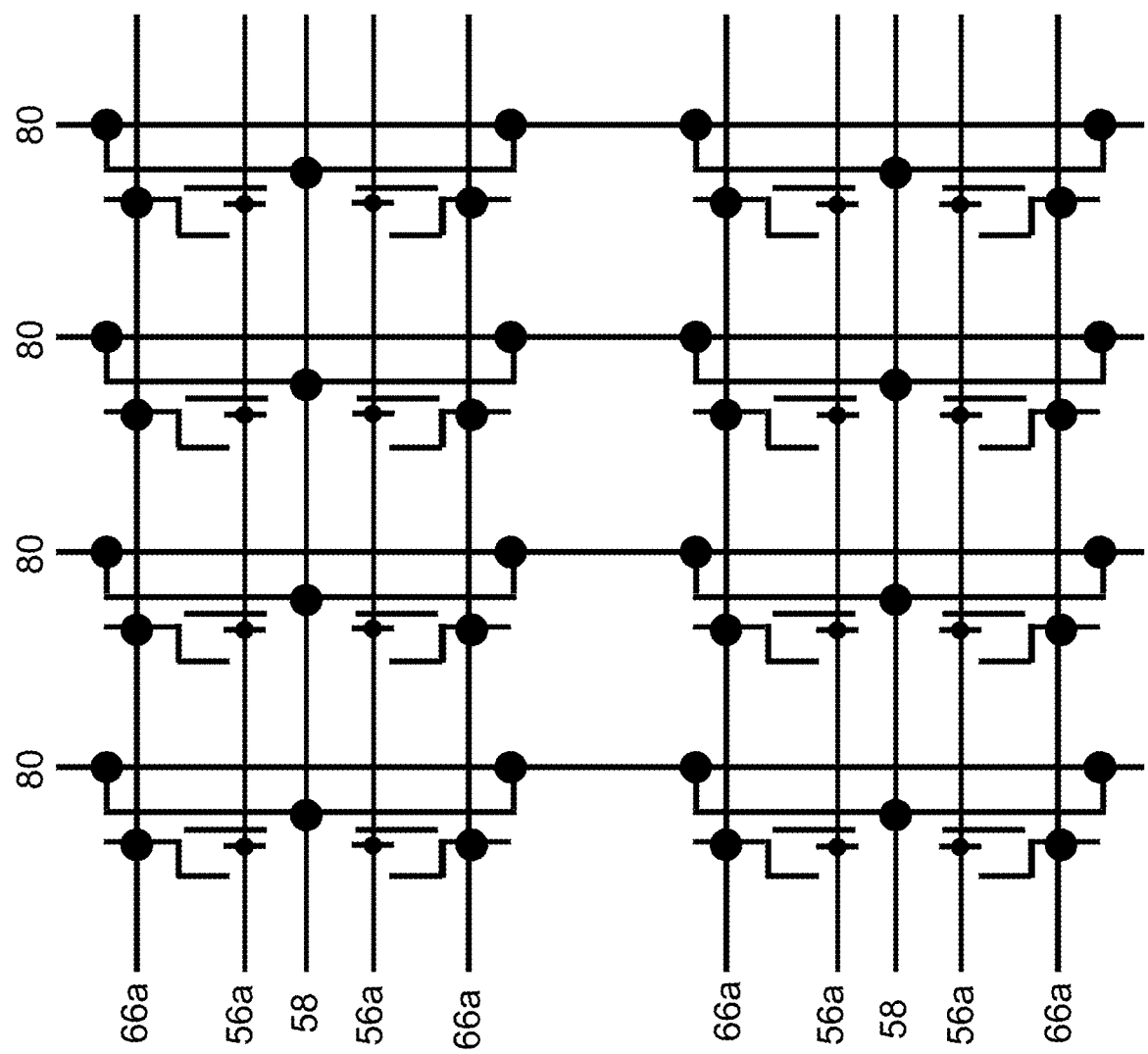
FIG. 16 is a schematic diagram showing the configuration of an array of the pairs of memory cells.

The architecture of a memory array formed of memory cells 76 is schematically shown in FIG. 16. The pairs of memory cells 76 are arranged in rows and columns, where the pairs of memory cells 76 are formed end to end to form the columns. For each row of memory cells 76, the word line gates 66a are formed as a continuous line connecting together all the word line gates 66a for the entire row of memory cells 76, and the coupling gates 56a are formed as a continuous line connecting together all the coupling gates 56a for the entire row of memory cells 76. For each row of memory cell pairs, the source regions 58 are formed as a continuous diffusion (or connected to a continuous line) connecting together all the source regions 58 for the entire row of pairs of memory cells 76. Each column of memory cells 76 includes a bit line 80 which electrically connects to all the contacts 74 (and therefore to all the drain regions 70) for all the memory cells 76 in the column.

FIG. 17 shows exemplary, non-limiting examples of voltages and current for read, erase, and program operations, respectively, for the various lines in FIG. 16 that include (i.e., labeled "Sel.") or do not include (i.e., labeled "Uns.") the memory cell(s) 76 selected for the operation. The selected memory cell 76 is erased (where electrons are removed from the floating gate 44a) by placing a positive voltage on the word line gate 66a, while maintaining a zero voltage on each of bit line 80, source regions 58 and coupling gates 56a, which causes electrons on the floating gate 44a to tunnel through the intermediate insulation to the word line gate 66a via Fowler-Nordheim tunneling. An entire row of memory cells 76 are erased simultaneously. The selected memory cell 76 is programmed (where electrons are placed on the floating gate 44a) by placing positive voltages on the word line gate 66a, coupling gate 56a and source region 58. Electron current will flow from the source region 58 towards the drain region 70, where some of the electrons will be injected through the intermediate insulation provided by insulation layer 64 onto the floating gate 44a. The selected memory cell 76 is read by placing positive read voltages on the drain region 70 (connected to bit line 80), word line gate 66a (which turns on the channel region under the word line gate 66a) and coupling gate 56a, and a zero voltage on the source region 58. If the floating gate 44a is positively charged (erased), current will flow across the channel region 78, which is sensed as the erased or "1" state. If the floating gate 44a is negatively charged (programmed), current will not flow (or there will be little flow) across the channel region 78, which is sensed as the programmed or "0" state.

There are many advantages of the memory cell 76 and its formation. Having the lower surface 56b of coupling gate 56a match the shape of the upper surface 44b of floating gate 44a (by virtue of insulation layer 54 therebetween having a uniform thickness) enhances capacitive coupling between the coupling gate 56a and floating gate 44a, for better read and program operational performance. The insulation spacers 62 can be made sufficiently thick to reduce capacitive coupling between the floating gate 44a and the word line gate 66a, for better read, program and erase operational performance. There is no conductive gate between the floating gates 44a and coupling gates 56a in the area above the source region 58 that could result in unwanted capacitive coupling between gates of different memory cells 76 and/or the common source region 58. Using both the oxidation process and a sloped etch process in forming the floating gate 44a results in a more pronounced curved shape or concave shape for the upper surface 44b of the floating gate 44a (and therefore a sharper edge 44d), for better erase performance. The side surfaces of the floating gate 44a and coupling gate 56a (facing away from the word line gate 66a and over the source region 58) are self-aligned to each other (i.e., side surface of coupling gate 56a dictates the location of the etch of the conductive layer 44 that results on the side surface of floating gate 44a over source region 58, see FIGS. 8-9).

Figure 18:
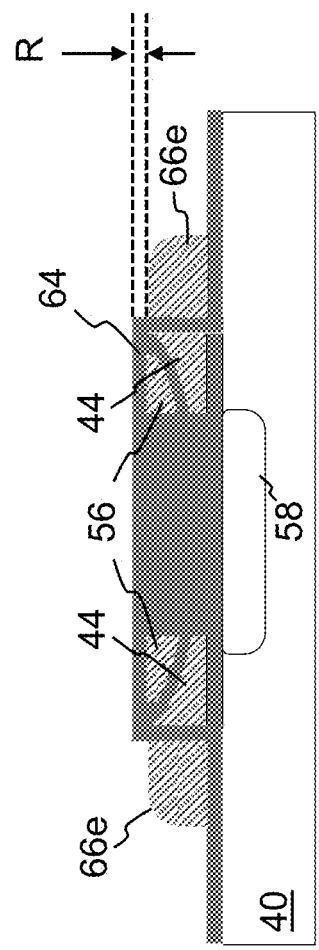
FIGS. 18-21 are cross sectional views illustrating the steps in forming pairs of memory cells according to an alternate embodiment.
Figure 19:
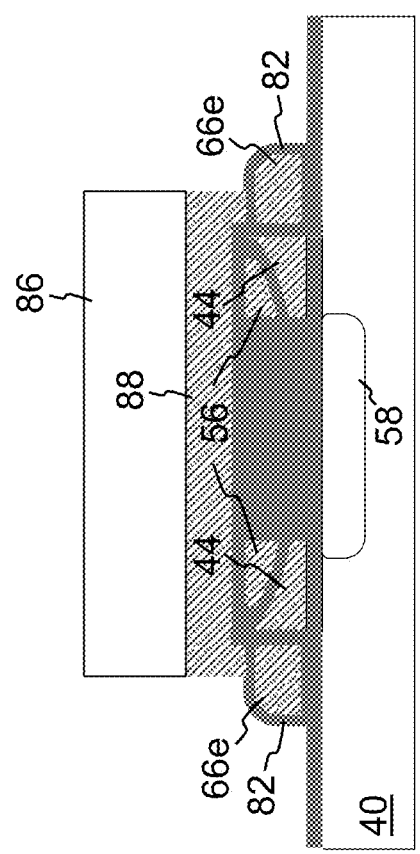
Figure 20:
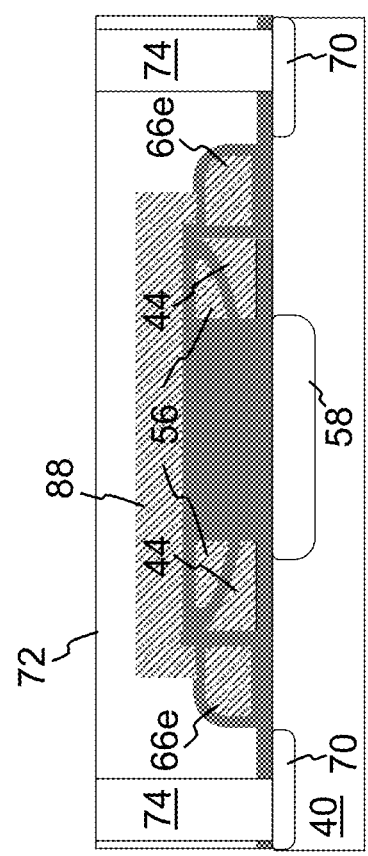

FIGS. 18-21 show an alternate embodiment for forming the memory cells 76. This embodiment begins with the structure shown in FIG. 12 (after the formation of conductive layer 66). An etch is used to remove conductive layer 66 except for (third) conductive spacers 66e of conductive layer 66, as shown in FIG. 18. The etch is performed such that the upper surface of conductive spacer 66e is recessed below the portion of insulation layer 64 on conductive spacers 56 by a recess amount "R". This recess amount R will result in an erase gate notch as further explained below. A (fifth) insulation layer 82 such as oxide is formed on conductive spacers 66e (e.g. by deposition or by thermal oxidation). A (third) conductive layer such as polysilicon is formed over the structure. Photoresist 86 is formed over the conductive layer, and removed except for a block of photoresist 86 positioned vertically over conductive spacers 56 and partially over conductive spacers 66e. An etch is then used to remove portions of the conductive layer except for a block of conductive material 88 under the block of photoresist 86, as shown in FIG. 19. After photoresist 86 is removed, an implantation is performed to form drain regions 70 in the substrate 40 adjacent the conductive layer 82 on conductive spacers 66e. The structure is covered in insulation material 72 such as ILD oxide, and contacts 74 extending through the insulation material 72 and to the drain regions 70 are formed by a masking step, etching through the insulation material to create contact holes that expose the drain regions 70, and filling the contact holes with conductive material, as shown in FIG. 20. Contacts are similarly formed to each of conductive spacers 66e and conductive spacers 56, in one embodiment, simultaneously with the formation of contacts 74.

Figure 21:
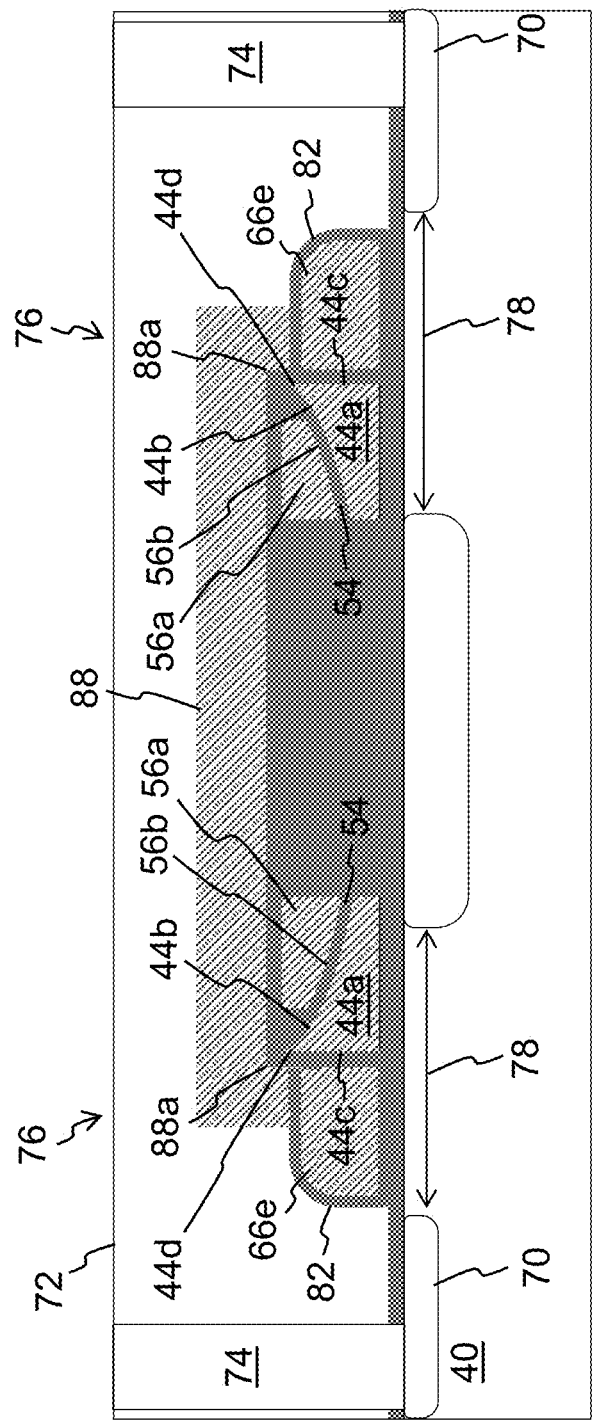

The final memory cell structure for the alternate embodiment is shown in FIG. 21, and is similar to the memory cell structure shown in FIG. 15 except the conductive spacers 66e, which are the word line gates, are disposed laterally and indirectly adjacent to the floating gates 44a (i.e., without any portion that is partially over floating gate 44a). Instead, block of conductive material 88 is an erase gate that extends over both floating gates 44a, both coupling gates 56a, and at least partially over both word line gates formed from conductive spacers 66e (i.e., there is at least some vertical overlap between the erase gate formed of block of conductive material 88 and the word line gates formed from conductive spacers 66e), of the pair of memory cells 76. The erase gate formed of block of conductive material 88 includes notches 88a facing the sharp edges 44d of the floating gates 44a (for enhanced tunneling during erase). This alternate embodiment is advantageous because it reduces the capacitive coupling between the floating gate 44a and word line gate formed from conductive spacers 66e (due to the word line gate formed from conductive spacers 66e not having a portion that extends up and over the floating gate 44a), and limits capacitive coupling between the floating gates 44a and the erase gate formed of block of conductive material 88 due to the intervening coupling gate 56a, while still providing efficient erase by virtue of notch 88a facing sharp edge 44d, and preserving the increased capacitive coupling between the floating gate 44a and coupling gate 56a as described above.

Figure 22:
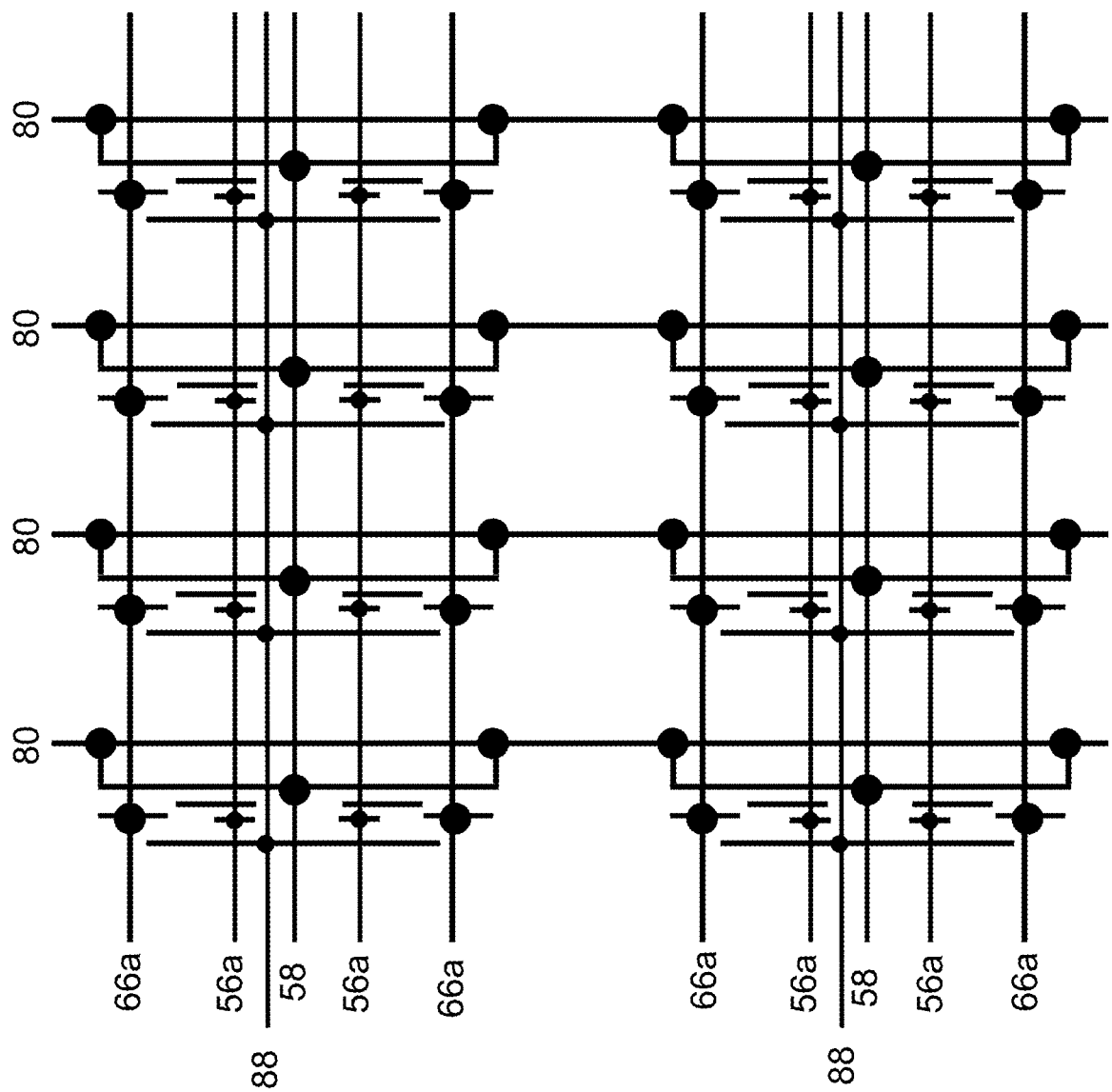
FIG. 22 is a schematic diagram showing the configuration of an array of the pairs of memory cells according to the alternate embodiment.

The architecture of a memory array formed of memory cells 76 of the alternate embodiment is shown in FIG. 22, which is similar to the architecture as described above with respect to FIG. 16 except that for each row of memory cell pairs, erase gate formed of block of conductive material 88 is formed as a continuous line connecting together all the erase gates formed of block of conductive material 88 for the entire row of memory cell pairs. FIG. 23 shows exemplary, non-limiting examples of voltages and current for read, erase, and program operations, respectively, for the various lines in FIG. 22 that include (i.e., labeled "Sel.") or do not include (i.e., labeled "Uns.") the memory cell(s) 76 selected for the operation. One operational difference for the alternate embodiment is that the positive voltage used to erase the memory cells 76 is applied to the erase gate formed of block of conductive material 88 instead of the word gate line gates formed from conductive spacers 66e.

It is to be understood that the claims are not limited to the embodiment(s) described above and illustrated herein, but encompasses any and all variations falling within the scope of any claims. For example, references to the present embodiments and examples herein are not intended to limit the scope of any claim or claim term, but instead merely make reference to one or more features that may be covered by one or more of the claims. Materials, processes and numerical examples described above are examples only, and should not be deemed to limit the claims. Further, as is apparent from the claims and specification, not all method steps need be performed in the exact order illustrated or claimed, but rather in any order that allows the proper formation of the memory device of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A memory cell, comprising:
    spaced apart source and drain regions in a semiconductor substrate with a channel region of the semiconductor substrate extending there between;
    a floating gate disposed above and insulated from a first portion of the channel region for controlling a conductivity of the first portion of the channel region, wherein the floating gate includes an upper surface having a concave shape that terminates at a side surface of the floating gate at a sharp edge;
    a word line gate that includes:
        a first portion disposed above and insulated from a second portion of the channel region for controlling a conductivity of the second portion of the channel region,
        a second portion disposed at least partially above the floating gate, and
        a notch facing the sharp edge of the floating gate adjacent to the word line gate; and
    a coupling gate disposed above and insulated from the floating gate, wherein the coupling gate includes a lower surface that:
        faces the upper surface of the floating gate,
        has a shape matching the concave shape of the upper surface of the floating gate, and
        is insulated from the upper surface of the floating gate by an insulation layer of uniform thickness.

2. The memory cell of claim 1, wherein the second portion of the word line gate is further disposed at least partially above the coupling gate.

3. A memory cell, comprising:
    spaced apart source and drain regions in a semiconductor substrate with a channel region of the semiconductor substrate extending there between;
    a floating gate disposed above and insulated from a first portion of the channel region for controlling a conductivity of the first portion of the channel region, wherein the floating gate includes an upper surface having a concave shape that terminates at a side surface of the floating gate at a sharp edge;
    a word line gate disposed above and insulated from a second portion of the channel region for controlling a conductivity of the second portion of the channel region;
    a coupling gate disposed above and insulated from the floating gate, wherein the coupling gate includes a lower surface that:
        faces the upper surface of the floating gate,
        has a shape matching the concave shape of the upper surface of the floating gate, and
        is insulated from the upper surface of the floating gate by an insulation layer of uniform thickness; and
    an erase gate disposed above and insulated from the floating gate and the coupling gate, and including a notch facing the sharp edge of the floating gate.

4. The memory cell of claim 3, wherein the erase gate is further disposed at least partially above the word line gate.

* * * * *